(12) United States Patent
Jain et al.

(10) Patent No.: US 12,413,262 B2
(45) Date of Patent: Sep. 9, 2025

(54) LINK LOSS DETECTION

(71) Applicant: MAXLINEAR, INC., Carlsbad, CA (US)

(72) Inventors: Raj Kumar Jain, Bangalore (IN); Ravindra Singh, Bangalore (IN)

(73) Assignee: MaxLinear, Inc., Carlsbad, CA (US)

( * ) Notice: Subject to any disclaimer, the term of this patent is extended or adjusted under 35 U.S.C. 154(b) by 750 days.

(21) Appl. No.: 15/527,123

(22) PCT Filed: Nov. 18, 2015

(86) PCT No.: PCT/EP2015/076965
§ 371 (c)(1),
(2) Date: May 16, 2017

(87) PCT Pub. No.: WO2016/079180
PCT Pub. Date: May 26, 2016

(65) Prior Publication Data
US 2019/0058503 A1 Feb. 21, 2019

Related U.S. Application Data

(60) Provisional application No. 62/081,592, filed on Nov. 19, 2014.

(51) Int. Cl.
| H04B 3/46 | (2015.01) |
| H03M 13/11 | (2006.01) |
| H04B 3/32 | (2006.01) |
| H04L 1/00 | (2006.01) |
| H04M 11/06 | (2006.01) |

(52) U.S. Cl.
CPC .......... *H04B 3/46* (2013.01); *H03M 13/1105* (2013.01); *H04B 3/32* (2013.01); *H04L 1/0061* (2013.01); *H04L 1/0057* (2013.01); *H04L 1/006* (2013.01); *H04M 11/062* (2013.01)

(58) Field of Classification Search
CPC ... H04B 3/46; H04M 13/1105; H04M 11/062; H04L 1/0061
See application file for complete search history.

(56) References Cited

U.S. PATENT DOCUMENTS

| 7,212,492 B1* | 5/2007 | Au ...................... H04L 41/0681 |
| | | 370/229 |
| 7,248,587 B1* | 7/2007 | Sharma ............... H04L 41/0663 |
| | | 370/394 |
| 7,743,313 B2 | 6/2010 | Jain et al. |

(Continued)

FOREIGN PATENT DOCUMENTS

| CN | 101163054 A | 4/2008 |
| CN | 101369964 A | 2/2009 |

(Continued)

OTHER PUBLICATIONS

International Search Report for PCT/EP2015/076965, Dated Feb. 8, 2016.

(Continued)

*Primary Examiner* — Parth Patel
(74) *Attorney, Agent, or Firm* — Buchalter; Jason W. Croft

(57) ABSTRACT

A coded signal is received via a physical link and decoded. A link loss of the physical link is detected based on at least one of the coded signal and said decoding.

20 Claims, 8 Drawing Sheets

(56) References Cited

U.S. PATENT DOCUMENTS

| | | | |
|---|---|---|---|
| 7,860,981 B1* | 12/2010 | Vinokour | H04L 67/141 709/227 |
| 7,970,966 B1* | 6/2011 | Hobbs | G06F 3/1454 348/474 |
| 8,081,560 B2* | 12/2011 | Van Wijngaarden | H04B 3/32 370/201 |
| 8,306,097 B2 | 11/2012 | De Lind Van Wijngaarden et al. | |
| 8,683,095 B1* | 3/2014 | Ni | H04L 1/0061 370/395.52 |
| 8,717,863 B2* | 5/2014 | Schenk | H04B 3/32 370/201 |
| 2005/0047498 A1* | 3/2005 | Gao | H04B 3/46 375/224 |
| 2005/0166124 A1* | 7/2005 | Tsuchinaga | G10L 19/005 714/776 |
| 2005/0180336 A1* | 8/2005 | Kim | H04L 1/0061 370/252 |
| 2005/0220180 A1* | 10/2005 | Barlev | H04L 12/2856 375/222 |
| 2006/0067412 A1* | 3/2006 | Qiu | H04L 27/2607 375/260 |
| 2006/0193396 A1* | 8/2006 | Li | H04B 7/061 375/267 |
| 2007/0030889 A1* | 2/2007 | Yu | H04L 12/66 375/222 |
| 2007/0091916 A1* | 4/2007 | Yu | H04L 1/0041 370/464 |
| 2007/0157065 A1* | 7/2007 | Pons | H03M 13/1102 714/758 |
| 2007/0260965 A1* | 11/2007 | Schmidt | H04L 1/0045 714/799 |
| 2007/0280339 A1* | 12/2007 | Oksman | H04B 1/10 375/222 |
| 2008/0065968 A1* | 3/2008 | Jain | H03M 13/2732 714/784 |
| 2008/0107089 A1* | 5/2008 | Larsson | H04L 45/26 370/338 |
| 2008/0176517 A1* | 7/2008 | Lee | H04N 21/6131 455/63.1 |
| 2008/0298444 A1* | 12/2008 | Cioffi | H04L 43/106 375/222 |
| 2009/0083234 A1* | 3/2009 | Yeom | H04L 12/12 |
| 2009/0213916 A1* | 8/2009 | Liu | H04L 12/2898 375/220 |
| 2009/0274242 A1* | 11/2009 | Kwon | H03M 13/2936 375/295 |
| 2009/0313530 A1* | 12/2009 | Becker | H03M 13/41 714/792 |
| 2010/0117904 A1* | 5/2010 | Miyatani | H04B 7/0413 342/373 |
| 2010/0185791 A1* | 7/2010 | Pons | H04M 11/062 710/30 |
| 2011/0110402 A1* | 5/2011 | Schenk | H04L 1/0001 375/219 |
| 2011/0200080 A1* | 8/2011 | Fang | H04B 3/32 375/222 |
| 2012/0224470 A1* | 9/2012 | Jeong | H04W 36/08 370/221 |
| 2012/0243404 A1* | 9/2012 | Goodson | H04B 3/32 370/222 |
| 2012/0263060 A1* | 10/2012 | Suzuki | H04W 52/365 370/252 |
| 2013/0070826 A1* | 3/2013 | Nielsen | H04B 3/50 375/222 |
| 2013/0130737 A1* | 5/2013 | Kobayashi | H04W 52/242 455/522 |
| 2013/0177306 A1* | 7/2013 | Pfau | H04B 10/5561 398/9 |
| 2013/0229905 A1* | 9/2013 | Schenk | H04M 11/062 370/201 |
| 2014/0023127 A1* | 1/2014 | Pereira | H04B 3/487 375/224 |
| 2014/0055776 A1* | 2/2014 | Hathorn | H04L 43/0805 356/73.1 |
| 2014/0089770 A1* | 3/2014 | Wei | H04L 1/0061 714/807 |
| 2014/0098705 A1* | 4/2014 | Chow | H04L 12/2898 370/254 |
| 2014/0143578 A1 | 5/2014 | Cenizal et al. | |
| 2014/0314134 A1* | 10/2014 | Dardenne | H04B 3/46 375/227 |
| 2014/0359381 A1* | 12/2014 | Takeuchi | G06F 11/1048 714/704 |
| 2015/0046775 A1* | 2/2015 | Prodan | H04L 1/0076 714/776 |
| 2015/0063551 A1* | 3/2015 | Kuipers | H04M 3/34 379/1.03 |
| 2015/0085634 A1* | 3/2015 | Yu | H03F 1/3241 370/201 |
| 2015/0110205 A1* | 4/2015 | Jin | H04L 1/0054 375/257 |
| 2015/0138972 A1* | 5/2015 | Peeters | H04M 11/062 370/235 |
| 2015/0309852 A1* | 10/2015 | Urban | G06F 11/076 714/704 |
| 2016/0037128 A1* | 2/2016 | Van der Auwera | H04N 7/147 348/14.13 |
| 2016/0056989 A1* | 2/2016 | Murakami | H04L 27/34 375/298 |
| 2016/0084895 A1* | 3/2016 | Imhof | G01R 31/11 702/58 |
| 2016/0156383 A1* | 6/2016 | Nuzman | H04B 3/487 375/257 |
| 2016/0277564 A1* | 9/2016 | Rohlfing | H04B 3/46 |
| 2017/0134569 A1* | 5/2017 | Tu | H04B 3/487 |
| 2017/0250731 A1* | 8/2017 | Medeiros | H04B 3/32 |

FOREIGN PATENT DOCUMENTS

| | | | | |
|---|---|---|---|---|
| EP | 1130918 A2 * | 9/2001 | | H03M 13/256 |
| WO | WO-1993014572 A1 * | 7/1993 | | H04B 1/10 |
| WO | 2009/148530 | 12/2009 | | |
| WO | WO-2009148530 A2 * | 12/2009 | | H04B 3/46 |
| WO | WO-2014062704 A1 * | 4/2014 | | H04B 3/46 |
| WO | 2016079180 A1 | 5/2016 | | |

OTHER PUBLICATIONS

International Preliminary Report on Patentability for International Application No. PCT/EP2015/076965, mailed Jun. 1, 2017, 8 Pages.

* cited by examiner

LINK LOSS DETECTION

This application is a National Phase entry application of International Patent Application No. PCT/EP2015/076965 filed on Nov. 18, 2015 which claims priority to U.S. Provisional Application 62/081,592 filed on Nov. 19, 2014 the contents of which are herein incorporated by reference in their entirety.

FIELD

Various embodiments relate to a method comprising detecting a link loss and to a corresponding device. In particular, various techniques relate to detecting a link loss of a physical link based on at least one of a coded signal and decoding of the coded signal.

BACKGROUND

Detecting the permanent removal of a physical link (link loss) can be helpful for controlling communication in a communication system. E.g., in context of Digital Subscriber Line (DSL) communication systems employing vectoring for removal of far-end crosstalk (FEXT), removal of physical links subject to link loss from a DSL vector engine calculation can be important in order to avoid negative impacts on remaining DSL channels handled by the DSL vector engine calculation.

Reference implementations for detecting link loss of a physical link typically detect the link loss with a comparably large latency and act slowly. E.g., the latency can be as high as between 2 and 10 seconds, e.g., according to the International Telecommunications Union (ITU) Telecommunication Standardization Sector (ITU-T) G.993.2 (2006), section 12.1.4.

Such a comparably high latency of detecting link loss can impose significant challenges on DSL vector engine calculations. When a line leaves, it can take a significant amount of time to detect the disconnection of the line. This typically results in a performance loss of data rate during this transitioning phase between link loss and detection of link loss.

SUMMARY

Therefore, a need exists for advanced techniques of detecting link loss of a physical link. In particular, a need exists for techniques which enable detecting the link loss at a comparably low latency and with a comparably high accuracy.

This need is met by the features of the independent claims. The features of the dependent claims define embodiments.

According to various embodiments, a method comprises receiving a coded signal via a physical link. The method further comprises decoding the coded signal to obtain a result signal. The method further comprises detecting a link loss of the physical link based on at least one of the coded signal and said decoding of the coded signal.

According to various embodiments, a device is provided. The device comprises a receiver configured to receive a coded signal via a physical link. The device further comprises a decoder configured to decode the coded signal to obtain a result signal. The device further comprises at least one processor configured to detect a link loss of the physical link based on at least one of the coded signal and said decoding of the coded signal.

According to various embodiments, a computer program product is provided. The computer program product comprises program code to be executed by at least one processor. Executing the program code causes the at least one processor to execute a method. The method comprises receiving a coded signal via a physical link. The method further comprises decoding the coded signal to obtain a result signal. The method further comprises detecting a link loss of the physical link based on at least one of the coded signal and said decoding of the coded signal.

It is to be understood that the features mentioned above and those yet to be explained below may be used not only in the respective combinations indicated, but also in other combinations or in isolation without departing from the scope of the invention.

BRIEF DESCRIPTION OF THE DRAWINGS

In the following, the invention will be explained in further detail with respect to embodiments illustrated in the accompanying drawings.

DETAILED DESCRIPTION OF EMBODIMENTS

Figure 1:
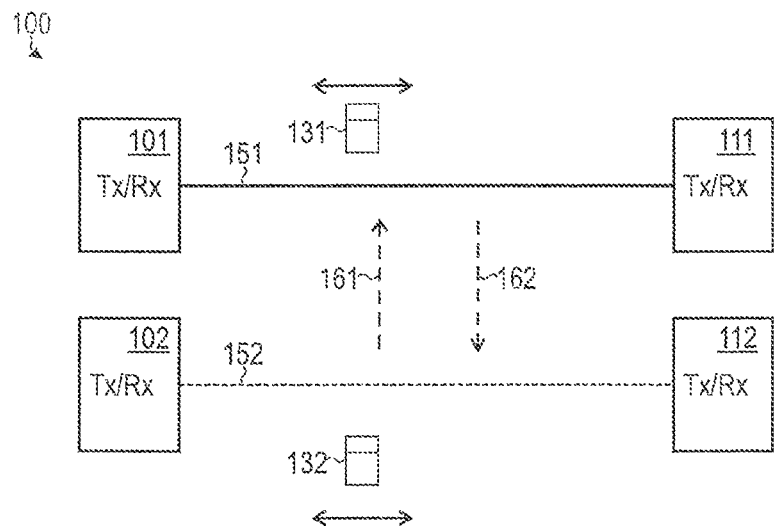
FIG. 1 schematically illustrates a communication system according to various embodiments, wherein the communication system comprises a physical link between two transceivers which experiences FEXT and near-end crosstalk (NEXT) from a further physical link arranged in the vicinity of the physical link.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, various techniques with respect to detecting a link loss of a physical link of a communication system are disclosed. Link loss may correspond to a scenario where the physical link is interrupted and communicated is thus prohibited.

In some examples, the link loss of the physical link can be detected based on a coded signal which is communicated via the physical link. E.g., the link loss can be detected based on an energy of the coded signal for various sample points in time domain and/or for various sample points in frequency domain.

In further examples, the link loss of the physical link can be detected, alternatively or additionally, based on decoding of the coded signal. Depending on the particular communication system implementing the techniques disclosed herein, techniques employed in the context of said decoding of the coded signal can vary. E.g., for various decoders such as a Viterbi decoder, a low-density parity check (LDPC) decoder, a Quadrature Amplitude Modulation (QAM) decoder, etc., it becomes possible to provide an error signal indicative of the presence of errors in said decoding. Different error metrics can be employed to determine the error signal, e.g., depending on the particular type of the decoder.

By such techniques as illustrated above, it becomes possible to detect the link loss of the physical link comparably quickly, i.e., with a comparably low latency. This enables to take actions as appropriate shortly after occurrence of the link loss. These action can relate to the physical link for which the link loss is detected; and/or can relate to further physical links which are in some way or the other affected by the link loss of the physical link. Depending on the particular communication system employed, a wide variety of actions is conceivable.

The techniques disclosed herein are generally applicable for various communication systems. Examples include such communication systems which communicate a coded signal according to Discrete Multitone (DMT) coding and modulation and/or Orthogonal Frequency Division Multiplexing (OFDM) coding and modulation. Examples include the Institute of Electrical and Electronics Engineers (IEEE) 802.11 Wireless Local Area Network (WLAN) communication protocol and the Third Generation Partnership Project (3GPP) Long-Term Evolution (LTE) or Universal Mobile Telecommunications system (UMTS) protocol. Further examples include Bluetooth and satellite communication. For illustrative purposes only, hereinafter, a particular focus will be put on physical links that are implemented via a copper wire and establish communication channels according to the DSL protocol. The DSL protocols include ITU-T G.992.X (ADSL and ADSL 2+), G.993.1 (VDSL1), G.993.2 (VDSL2), and G.9700/G.9701 (G.Fast).

E.g., the various techniques disclosed herein can be applicable for communication system employed for the Internet of Things (IoT) where a large number of devices communicates. Here, a low latency for link loss detection can be advantageous to ensure robust signaling.

Making reference to FIG. 1, data 131 is sent and/or received (communicated) via a first physical link 151 and second data 132 is communicated via a second physical link 152.

The first data 131 and second data 132 may be control data, higher-layer payload data, and/or training data. Techniques disclosed herein generally relate to uni-directional and/or bidirectional communication, e.g., upstream (US) and/or downstream (DS) communication. Depending on US or DS communication, corresponding transceivers 101, 111, 102, 112 may operate as transmitters or receivers. Communicating via the physical links 151, 152 may be according to a frequency-division duplexing scheme (FDD) or according to a time-division duplexing scheme (TDD).

The first and second physical links 151, 152 experience mutual crosstalk, i.e., the first physical link 151 (second physical link 152) experiences first crosstalk 161 (second crosstalk 162) from the second physical link 152 (first physical link 151). Sometimes, this mutual crosstalk is also referred to as alien crosstalk. The crosstalk 161, 162 may comprise FEXT and/or NEXT.

The first and second physical links 151, 152 also experience intrinsic crosstalk. So-called impulse noise may hit a specific physical link 151, 152. In the various examples disclosed herein, the link loss of the physical link 151 may be detected based on the temporal evolution of the received coded signal in a time interval having a duration in the range of 3-50 milliseconds, preferably in the range of 5-8 milliseconds. Monitoring for, e.g., erroneous symbols over such a time interval may be motivated by the finding that a typical duration of impulse noise, e.g., where the physical link 151 is implemented via copper wire, is of the duration of 2 to 5 milliseconds.

Figure 2:
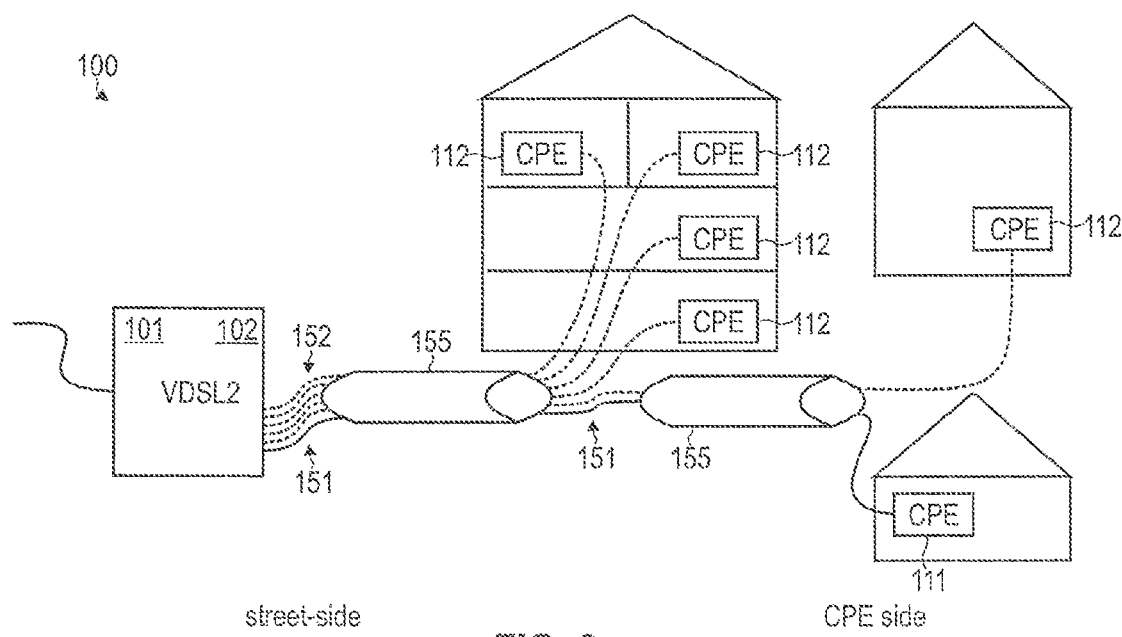
FIG. 2 schematically illustrates a deployment scenario of a communication system according to various embodiments for implementing a DSL channel via a physical link being formed by a copper wire.

FIG. 2 illustrates aspects of a typical VDSL2 deployment scenario. The physical links 151, 152 implemented as copper wires connect the Digital Subscriber Line Access Multiplexer (DSLAM) 101, 102 to the VDSL2 transceiver units, sometimes referred to as remote terminals, at physical separated individual residences comprising customer premises equipment (CPE) 111, 112. The physical links 151, 152 share common cable binders 155 which increases NEXT and FEXT. VDSL2 employs DMT modulation with up to a 4096 subcarriers located on frequencies spaced by 4.3125 kilohertz or 8.625 Kilohertz. Due to the multiple physical links 151, 152 connected to the DSLAM 101, 102 and sharing a cable binder 155, NEXT and FEXT can be prominent.

Typically, NEXT is prominent above 1-2 MHz. Because of this, VDSL2 communication channels use non-overlapping DS/US frequency bands in FDD up to 30 MHz. This significantly mitigates NEXT. Thus, with NEXT being largely eliminated due to the FDD, FEXT typically dominates the remaining noise 161, 162. Crosstalk cancellation—also referred to as vector engine calculation for removing FEXT—significantly reduces the FEXT, thus effecting a performance improvement.

The vector engine calculation for removing FEXT on the physical link 152 should have access to information wither a given physical link 151 is connected or disconnected. Because of this, it can be helpful to detect the link loss of one of the physical links 151 at a comparably low latency. In detail, in a communication system as illustrated in FIGS. 1 and 2, each physical link 152 typically maintains its specific crosstalk coefficient or pre-coder coefficient corresponding to neighboring physical links 151. Each crosstalk coefficient of the particular line 152 (victim physical link) is estimated during a training, E.g., by measuring the effect of each neighboring physical link (disturber line) 151 on the victim physical link 152. Employing the DSL vector engine calculation, data communicated on a victim physical link 152 is manipulated by using crosstalk or pre-coder coefficients at the transmitter 101, 102, 111, 112 such that crosstalk 161, 162 of disturber physical links 151 is reduced. During a transitioning phase after link loss of the disturber physical link 151, data communicated on the victim physical link 152 is still manipulated by using crosstalk or pre-coder coefficients having been determined before the link loss. Therefore, the data communicated on the victim physical link 152 is artificially manipulated as if the disturber physical link 151 was actually still active. This reduces reliability of communication on the victim physical link 152. Therefore, it can be desirable to detect the link loss of the disturber physical link 151 comparably fast. Hereinafter, techniques are disclosed which enable to detect the link loss of the disturber physical link 151 comparably fast.

Link loss of the physical link 151 may occur where the corresponding copper wire is physically broken. A further source for link loss may be malfunctioning of the CPE 111 associated with the physical link 151. E.g., the CPE 111 may be powered down.

Techniques are disclosed herein which enable to reliably detect link loss of a disturber physical link 151 at a low latency.

Figure 3A:
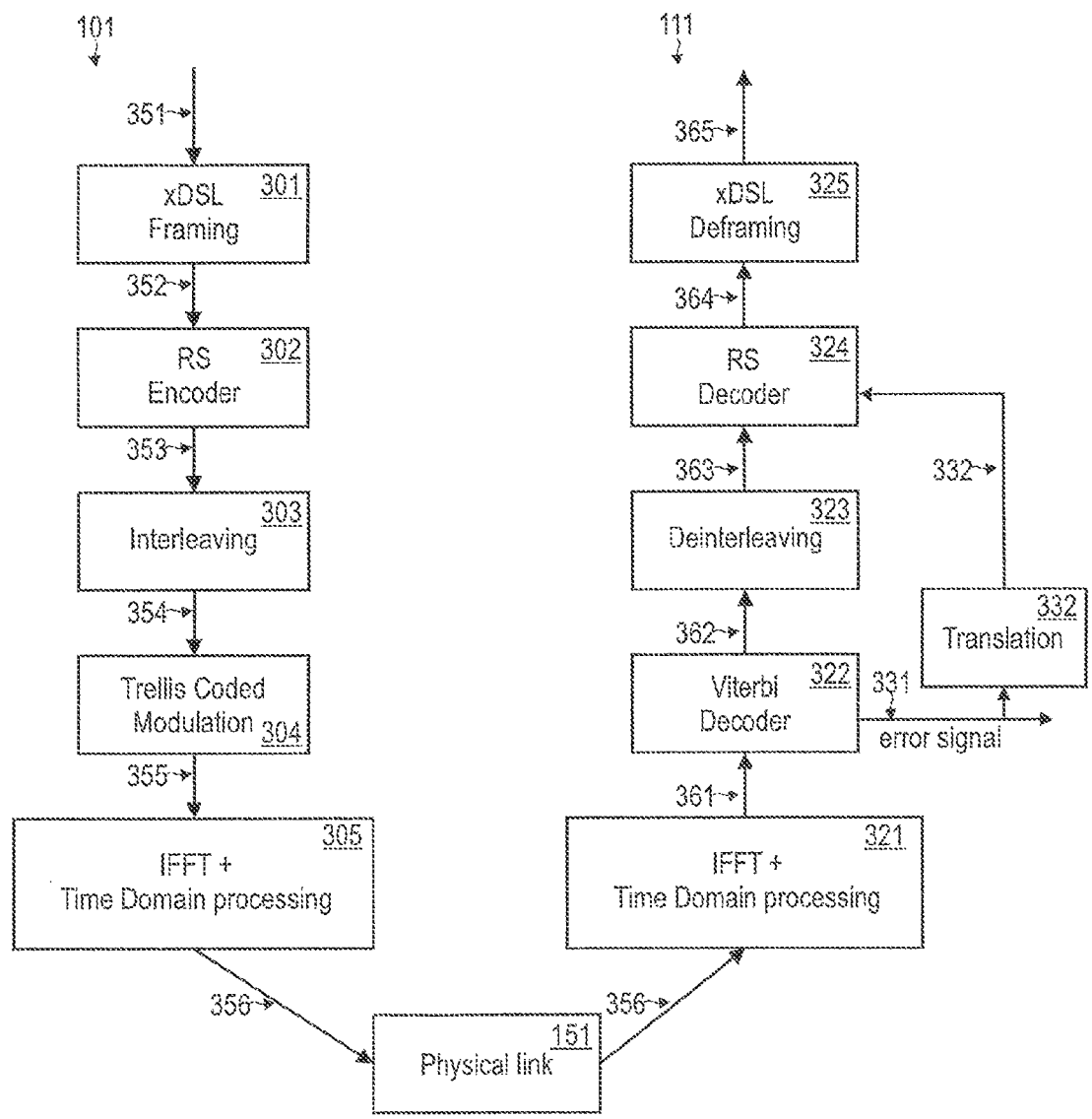
FIG. 3A schematically illustrates coding and modulation of a signal at a transmitter and decoding and demodulation of the signal at a corresponding receiver according to various embodiments.

FIG. 3A illustrates an embodiment which enables to detect the link loss of a physical link 151 comparably quickly. FIG. 3A illustrates an OFDM-based communication system.

Here, combined Forward Error Correction (FEC) based on checksums comprised in transmission frames, time and/or frequency interleaving, and/or Viterbi encoding is used for combating the effects of impulse noise affecting the physical link 151. The FEC is typically implemented by a redundancy encoder such as a LDPC decoder or a Reed-Solomon decoder. By providing an error signal indicative of the presence of errors in the signal output by the Viterbi decoder, a correction capability of the redundancy decoder can be almost doubled. Hereinafter, scenarios are disclosed, where the error signal is re-used for detecting link loss of the physical link 151.

The signal transmitted via the physical link is encoded and modulated by the transmitter 101 and decoded and demodulated by the receiver 111. For this, the OFDM-based communication system of FIG. 3A employs a plurality of carriers or tones which act as separate communication channels implemented via the physical link 151 to carry information between the transmitter 101 and the receiver 111. Each carrier is a group of one or more frequencies defined by a center frequency and a predefined bandwidth.

The physical link 151 is subject to various types of interference and noise. Interference and noise can corrupt the signal 356 received at the receiver 111 if compared to the signal 356 transmitted at the transmitter 101. Some sources of interference and noise can be modeled as additive white caution noise (AWGN). The impact of AWGN can be reduced greatly by channel estimation and channel decoding employing a Viterbi decoder. Channel estimation typically computes the signal-to-noise ratio (SNR) of the received signal 256 at the receiver 111. According to ODFM techniques, based on the computed SNR of each carrier, the number of data bits loaded on each carrier is determined (bit loading). Lower bit loading typically improves robustness of communication against errors.

Now explaining the functioning of the OFDM-based communication system of FIG. 3A in detail, at the transmitter 101, packetized data 351 is mapped to transmission frames at framing 301. The data 352 is then encoded by, e.g., RS encoding 302, to implement FEC. An interleaver 303 interleaves the encoded data 353, e.g., in time domain, to increase a robustness against impulse noise. The interleaved data 354 is then further encoded, e.g., using a Trellis coded modulation (TCM) encoder 304 or a QAM encoder (the latter not shown in FIG. 3A). The encoding at 304 further modulates the signal 354 onto different carriers of a DMT. Time and frequency domain processing is then performed at 305, e.g., comprising further interleaving and/or modulation onto different carriers in the high frequency spectrum and/or digital-to-analog conversion.

Thus, a coded signal 356 is communicated via the physical link 151 and received by a receiver 111. First, the coded signal 356 is processed in time and frequency domain 321; e.g., samples of the received analog signal are converted into digital domain. Further, data of different carrier frequencies can be separated by employing inverted Fast Fourier Transformation (IFFT). Thus, a coded signal 361 is obtained in digital domain.

Figure 4A:
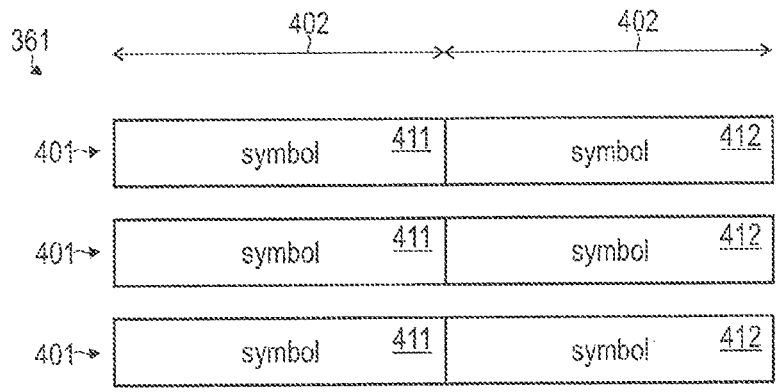
FIG. 4A illustrates resource blocks of a coded signal in time domain and frequency domain, the resource blocks being communicated between a transmitter and a receiver via a physical link according to various embodiments, the resource blocks corresponding to symbols.

An example structure of the signal 361 is illustrated in FIG. 4A. The signal comprises a plurality of symbols 411, 412, each symbol occupying a certain time resource block 402 and frequency resource block 401. The symbols 411, 412 are referred to DMT symbols. The different symbols 411, 412 may be separated in time domain by guard intervals (not shown in FIG. 4A). The different carriers 411 may be separated in frequency domain and/or may carry different phases. Each of the symbols 411, 412 may correspond to a sequence of bits comprising a number of bits as defined by the bit loading.

Referring again to FIG. 3A, a decoder 322 then decodes the signal 361. E.g., the decoder 322 can be a QAM decoder or a unit combining QAM decoding and Viterbi decoding. In the example of FIG. 3A, a Viterbi decoder 322 is employed. The decoder 322 attempts to reconstruct the symbols input into the encoder 304 in view of potential corruption by noise on the physical link 151. In case the encoder 304 uses QAM encoding, the decoder 322 also uses QAM decoding. In case the encoder 304 uses TCM encoding—which includes QAM encoding—, the decoder 322 also uses QAM decoding, followed by Viterbi decoding.

The reconstructed symbols are output by the decoder 322 as signal 362 and are input to a deinterleaver 323. The deinterleaver 323 produces the interleaved data as signal 363 which is provided to a second-stage decoder 324, i.e., in the example of FIG. 3A, a RS decoder 324. The decoder 324 provides the finally decoded result signal 364 to a de-framing unit 325 which strips off the transmission frames to provide higher-layer packetized data 365.

In the example of FIG. 3A, the Viterbi decoder 322 outputs an error signal 331 indicative of a presence of errors in said decoding of the Viterbi decoder 322. E.g., the error signal 331 can indicate which of the carrier symbols of signals 362 are likely to be erroneous. E.g., the decoder 322 may indicate that a whole DMT symbol 411, 412 of the signal 362 is corrupt. Based on interleaving properties, a translation unit 332 processes the addresses of the bits in the corrupt DMT symbols 411, 412 to form address data which indicates the addresses of bits in the de-interleaved signal 363. This address data is input to the RS decoder 324 so that the Reed Solomon decoder 324 is enabled to perform, e.g., erasure decoding. As can be seen from the above, the RS decoder 324 operates as a second-stage redundancy decoder based on the error signal 331. By providing redundancy coding/decoding, a likelihood of errors in the signal 364 can be further reduced. Corresponding techniques are described in detail in U.S. Pat. No. 7,743,313 B2, the entire disclosure of which is incorporated herein by reference, such that further details are not required to be illustrated in the present context.

Hereinafter, details of determining the error signal 331 are explained. E.g., where—as in the scenario of FIG. 3A—a Viterbi decoder 322 is employed, the survival path, sometimes also referred to as Viterbi path, having an extreme value of the corresponding metric is selected for providing the result signal 362. Typically, other Viterbi paths have significantly different metrics compared to the survival path in a scenario where Gaussian noise is present. This facilitates selection of the result signal 362; in particular, a confidence in selecting the result signal 362 may be comparably high. However, where impulse noise impacts the communication via the physical link 151, the metric values of all Viterbi paths are typically of the same order of magnitude for a substantial number of TCM encoding stages, i.e., a difference between different Viterbi paths of the Viterbi decoder is comparably small. In this case, selecting the survival path for providing the result signal 362 can become difficult and the confidence in selecting the result signal 362 may drop. Thus, in a scenario where the difference between different Viterbi paths of the Viterbi decoder is comparably small—e.g., below a predefined threshold —, the respective symbol of the result signal 362 is marked as erroneous in the error signal 331.

Above, example scenarios have been illustrated where the error signal 331 is provided by the Viterbi decoder 322. However, different examples, different decoders may be employed, such as a QAM decoder and/or a LDPC decoder. Also in such scenarios, it is possible to determine the error signal 331. Corresponding aspects are illustrated with respect to FIG. 4B.

Figure 4B:
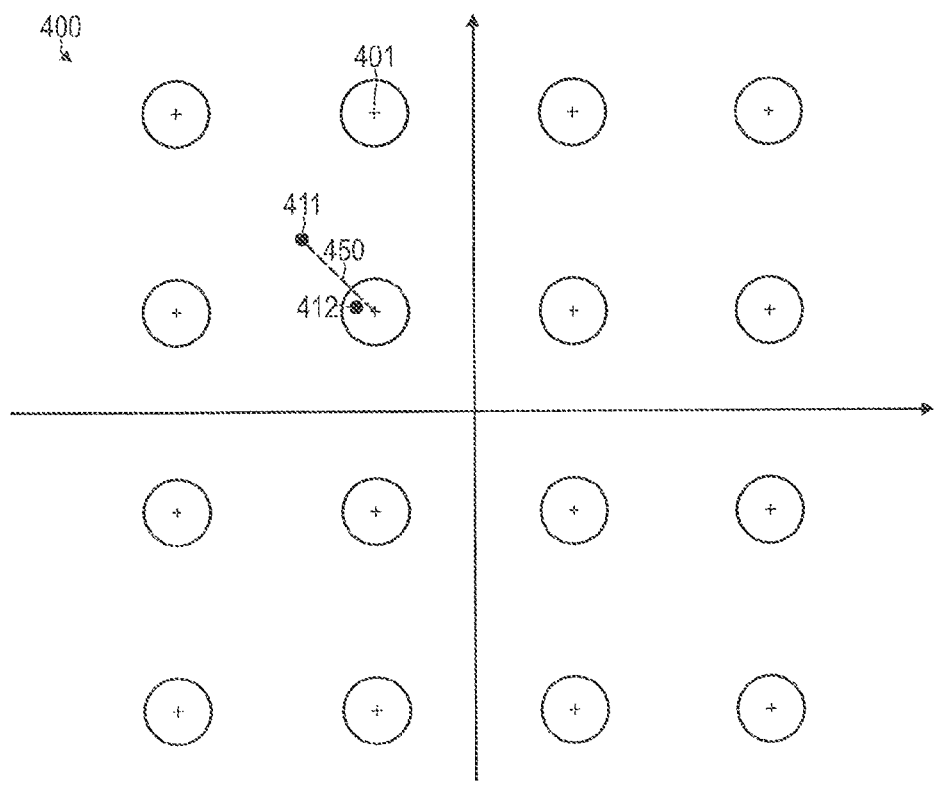
FIG. 4B schematically illustrates a constellation diagram of decoding and demodulating a symbol according to various embodiments.

FIG. 4B illustrates a constellation diagram 400 of, e.g., a QAM decoder or a LDPC decoder. The example of FIG. 4B in particular shows a 16-QAM constellation, in which each of 2 quadrature waves is modulated to take one of four possible amplitude values, so that the constellation includes 16 points in total. In different scenarios, different constellations may be employed. In particular, e.g., in DSL communication, different bit loading may be employed to encode a different number of bits per symbol 411, 412. As in conventional decoders, to obtain an estimate of what data the encoder 304 at the transmitter 101 intended to encode, the decoder 322 identifies which point of the corresponding constellation is closest to the received carrier symbol 401. Here, different metrics may be employed such as the Euclidean distance—which is typically employed for QAM—or the log-likelihood estimate—which is typically employed at the LDPC decoder. The error signal 331 may be indicative of the distance between the decoded symbol 411, 412 and the respective carrier 401. E.g., the error signal 331 may indicate the distance in quantitative terms. In other examples, the error signal 331 may indicate the distance in qualitative terms, only. E.g., the error signal 331 may flag a respective symbol as potentially being erroneous if the distance 450 of the corresponding symbol 411, 412 exceeds a certain threshold (illustrated by the circles in FIG. 4B).

Above, various techniques have been illustrated in order to provide and determine the error signal 331 indicative of the presence of errors in said decoding. Where the link loss is detected based on said decoding, it is now possible to employ the error signal 331 to identify the link loss. Here, different techniques may be employed for detecting the link loss depending on the error signal 331; in particular, the techniques may vary depending on the information content of the error signal 331.

Referring again to FIG. 3A, based on the error signal 331 provided by said decoding 322, it is then possible to detect the link loss. E.g., where the error signal 331 indicates a comparably high likelihood for a number of subsequent erroneous symbols 411, 412—e.g., corresponding to the above-mentioned time interval in the range of 3-15 ms—link loss may be detected. In one example, the error signal 331 may be indicative of a number of adjacent (in time domain) erroneous symbols 411, 412 of the coded signal. Then, it is possible to execute a threshold comparison between the number of adjacent erroneous symbols 411, 412 and a predefined threshold. The link loss may be detected based on said executing a threshold comparison. E.g., a counter may be maintained which is incremented for each continuous, erroneous symbols 411, 412. E.g., if an adjacent number of 5, 10, 50, or hundred symbols 411, 412 is erroneous/corrupted, link loss may be detected. In particular, the number of adjacent erroneous symbols 411, 412 may vary depending on properties such as a typical duration of impulse noise on the physical link 151 and/or a typical duration of the symbols 411, 412 and/or bit loading.

While above techniques have been disclosed which detect the link loss based on the error signal 331 of the first-stage decoder 322, in other examples the link loss may be alternatively or additionally detected based on the second-stage redundancy decoding 324. In some examples the second-stage redundancy decoder may output a further error signal (not shown in FIG. 3A) which may be used to detect the link loss.

Figure 3B:
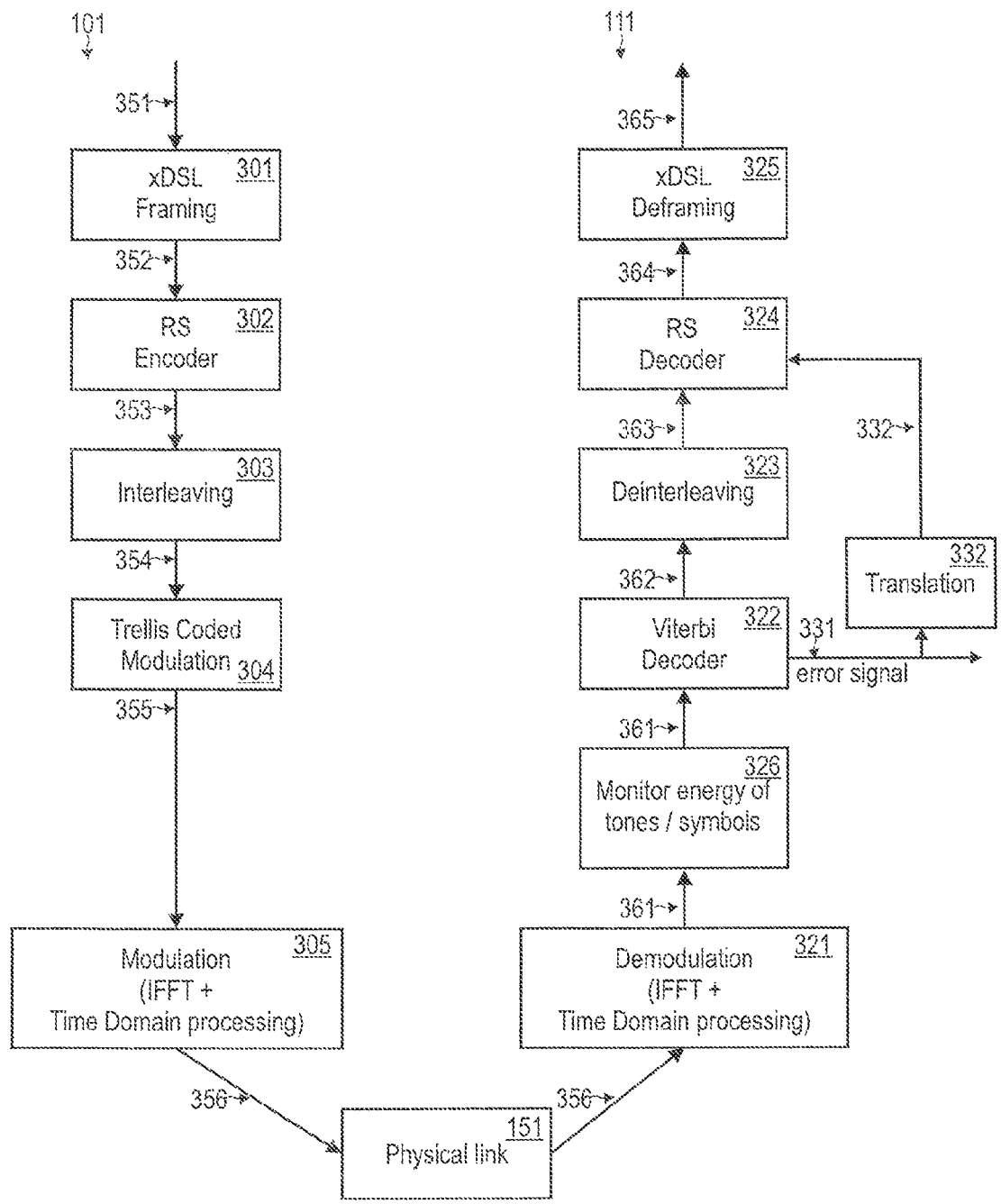
FIG. 3B schematically illustrates coding and modulation of a signal at a transmitter and decoding and demodulation of the signal at a corresponding receiver according to various embodiments.

Now turning to FIG. 3B, aspects of detecting the link loss of the physical link 151 based on the coded signal 361 are disclosed. E.g., it is possible to monitor, at 326, the energy of certain frequencies and/or time samples of the signal 361. The frequencies may correspond to certain carriers of the coded signal 356. The time samples may correspond to symbols of the signal 361. However, monitoring the energy in time domain and/or frequency domain may also be done independently of the time and/or frequency spacing of the coded signal 356.

In some examples, the energy levels of a plurality of resource blocks of the coded signal can be measured and the link loss can be determined based on the measured energy levels. Here, the resource blocks can correspond to the symbols and/or carriers of the coded signal 361. Then, a threshold comparison between the energy levels of the plurality of resource blocks and a predetermined threshold can be executed. The link loss may be determined based on said executing of the threshold comparison.

In some examples, adjacent time samples of the coded signal 361 and/or adjacent carriers of the coded signal 361 are monitored at 326. Thereby, the time evolution of the energy of the resource blocks can be tracked, thereby identifying the link loss more reliably. E.g., a counter may be maintained which is incremented for continuous, adjacent time samples and/or frequency samples of the coded signal 361 that have an energy below the predefined threshold. The counter may then compared to the predetermined threshold. If the number of adjacent time samples and/or frequency samples of the coded signal 361 is above a threshold, link loss may be detected. E.g., in time domain processing, if the energy of a certain amount of samples of the signal 361 is below the threshold over multiple symbols 411, 412, link loss can be detected. Typically, such a scenario equals a situation where no data communication via the physical link 151 is happening and only background noise is picked up by the receiver 111 and the physical link 151. Thus, link loss of the physical link 151 has occurred. E.g., in frequency domain processing, after IFFT de-modulation, if the energy of a certain amount of carriers in a specific frequency band of the signal 361 is below a certain threshold over multiple symbols 411, 412, the link loss can be detected. Again, the remaining energy picked up by the receiver 111 and the physical link 151 can be due to background noise.

Figure 5:
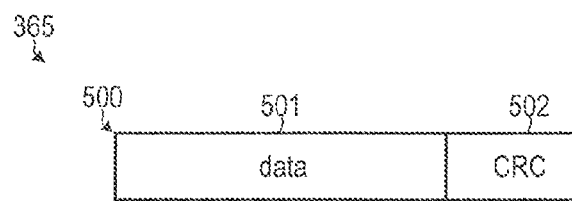
FIG. 5 illustrates a frame of a signal communicated between a transmitter and a receiver via a physical link according to various embodiments.

FIG. 5 illustrates aspects with respect to the result signal 365. The result signal 365 comprises the sequence of bits (not shown in FIG. 5) forming transmission frames 500. The transmission frames 500 comprise a data section 501 carrying higher-layer payload data in the checksum section 502 comprising a checksum such as a cyclic redundancy check (CRC). In some scenarios, it may be desirable to complement the detection of link loss of the physical link 151 implemented at early stages of the receiver 111—as explained above with respect to FIGS. 3A and 3B—by detection of link loss implemented at a later stage of the receiver 111. E.g., it may be possible that the link loss of the physical link 151 is further detected based on a checksum of at least one of the transmission frames 500 of the result signal 365. Typically, such a detection of the link loss may be associated with a comparably high latency, but may be comparably accurate.

Figure 6:
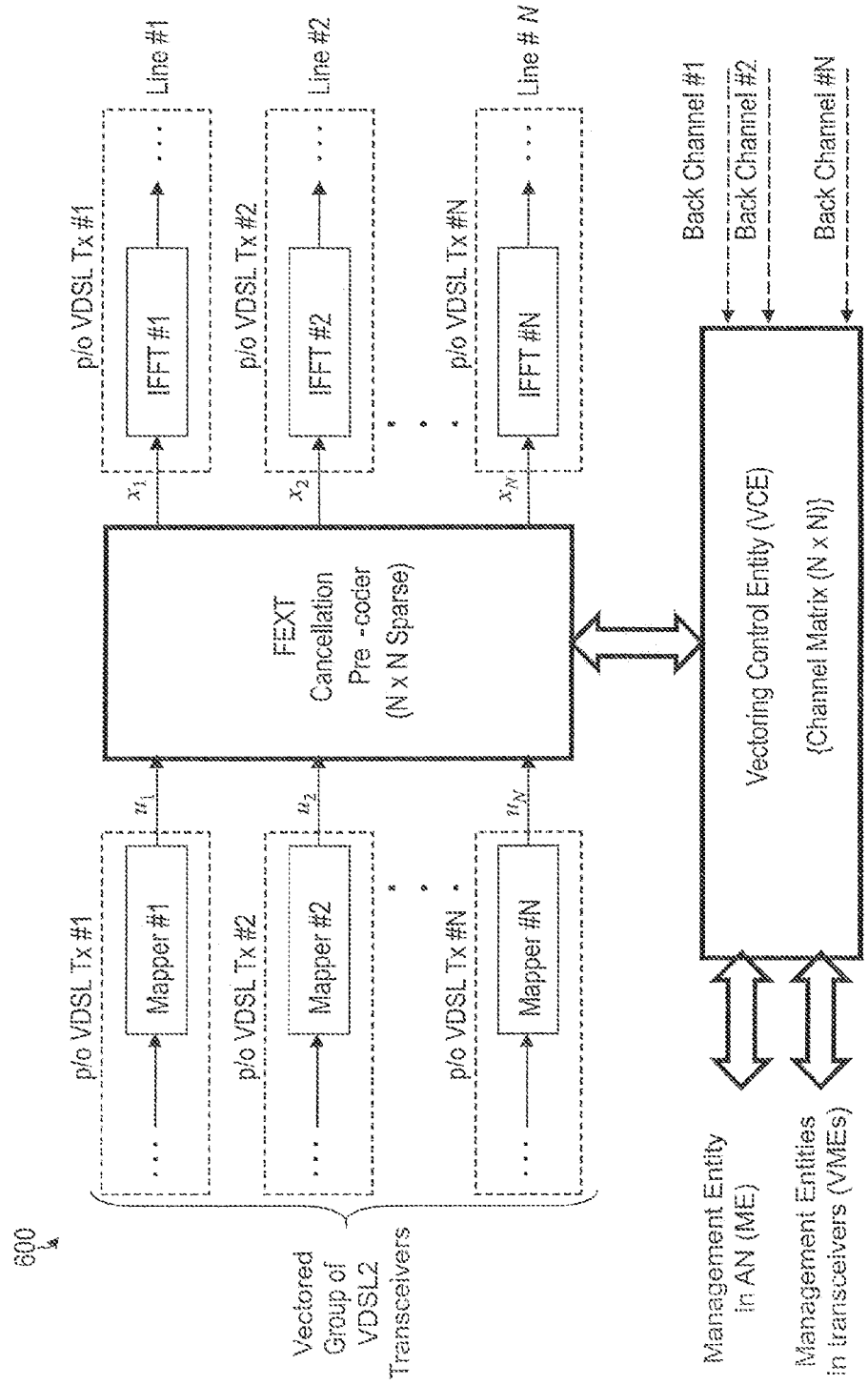
FIG. 6 illustrates a DSL vector engine calculation according to various embodiments.

FIG. 6 illustrates details of a DSL vector engine calculation for removing FEXT between the physical link 151 and the plurality of further links 152. Where link loss of the physical link 151 is detected, it is possible to remove the DSL channel implemented via the physical link 151 from the DSL vector engine calculation 600, but retain the further DSL channels implemented via the further physical links 152 at the DSL vector engine calculation 600. Where the transitioning phase is comparably small, because the link loss of the physical link 151 is detected at a low latency, negative impacts on the further DSL channels due the link loss can be mitigated.

Figure 7:
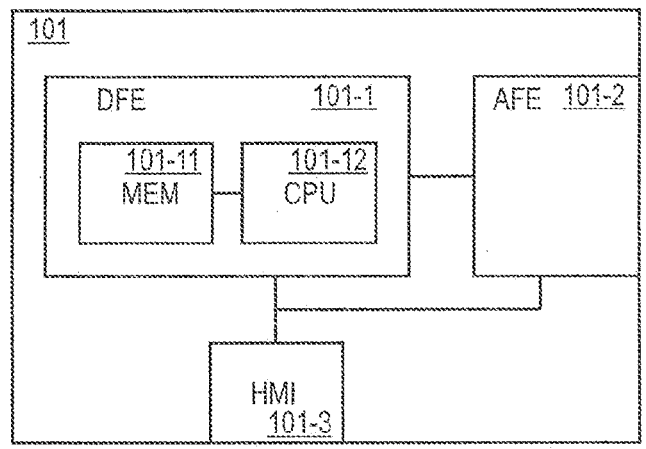
FIG. 7 illustrates a device according to various embodiments.

FIG. 7 is a schematic illustration of a device 101 according to various embodiments. The device 101 implements a transceiver for communicating on the physical link 151. The device implements communication on the physical link 151 via, e.g., a DSL channel. The device 101 comprises an analog front end (AFE) 101-2 and a digital front end (DFE) 101-1. Typically, the AFE 101-2 implements time domain and frequency domain processing 321 of the raw coded signal 356 received via an antenna or the like. The DFE 101-1 comprises a processor 101-12 and a memory 101-11. The memory 101-11 stores program code that may be executed by the processor 101-12 and may cause the processor 101-12 to execute techniques as illustrated above with respect to blocks 326, 322, 323, 324, and 325. In particular, the processor 101-12 may be configured to demodulate and/or decode the digitized raw signal 361. The device 101 further comprises a human machine interface (HMI) 101-3 configured to input information from a user and to output information to a user.

Figure 8:
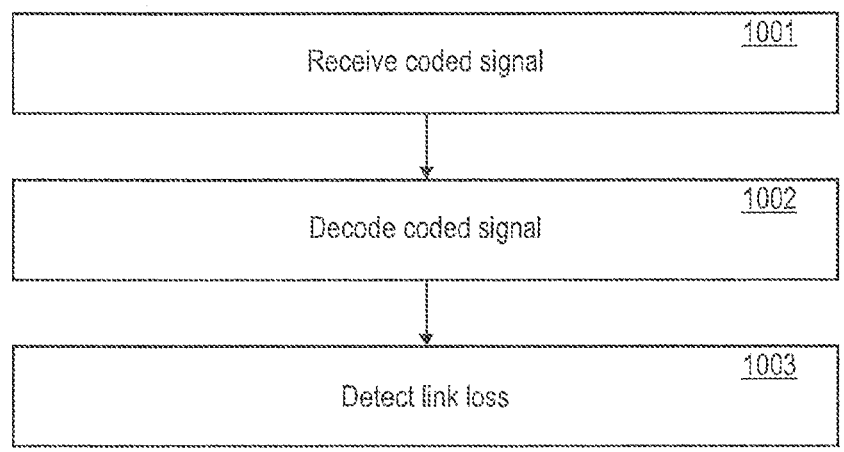
FIG. 8 is a flowchart of a method according to various embodiments.

Executing program code stored at the memory 101-11 by the processor 101-12 may cause the processor 101-12 to execute the method as illustrated in FIG. 8. First, at 1001, the raw coded signal 356 is received. Potentially, frequency and/or time domain processing 321 is applied to the raw coded signal 356, e.g., by the AFE 101-2. Thereby, the coded signal 361 is obtained.

Next, at 1002, the coded signal 361 is decoded, e.g., by a Viterbi decoder 321, a QAM decoder, and/or a LDPC decoder. Depending on the particular decoder employed, it may be required to provide an additional demodulation before decoding the coded signal 361.

At 1003, the link loss is detected. The link loss of the physical link 151 may be detected based on a temporal evolution of the coded signal 356, 361 and/or said decoding; here, the temporal evolution may be considered for a duration in the range of 3-15 ms or 5-8 ms. In particular, the link loss may be detected based on properties of the decoding at 1002 and/or may be detected based on properties of the coded signal 361, e.g., based on energy across a plurality of samples in time domain and/or frequency domain. Where the link loss is detected based on properties of the decoding at 1002, the decoding may provide the error signal 331 based on which the link loss may be detected. It is also possible to detect the link loss based on second-stage decoding, e.g., by a RS decoder.

Figure 9:
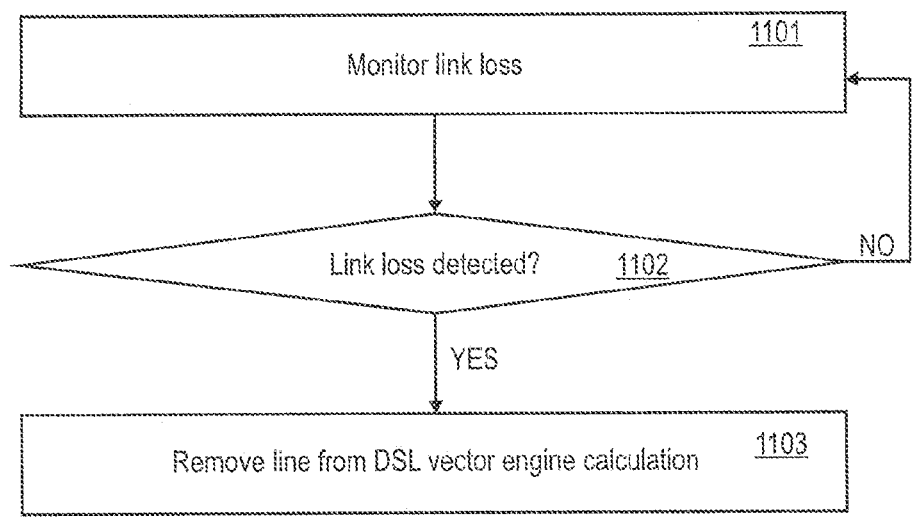
FIG. 9 is a flowchart of a method according to various embodiments.

Steps 1001-1003 may be reiterated over the course of time in order to monitor the link loss, see FIG. 9, 1101. Once link loss is detected at 1102, the corresponding physical line 151 can be removed from the DSL vector engine calculation 400, 1103. Because link loss can be detected comparably quickly, 1103 can be executed soon after the link loss actually occurred such that performance of further physical links 152 is not degraded for an extended transition phase.

Summarizing, above techniques have been disclosed which enable to detect loss of a physical link in a communication system with a comparably low latency. In particular, e.g. for an application within a DSL communication channel, link loss may be detected after 5 to 8 milliseconds; which is considerably smaller than legacy implementations, where the detection of a link loss may take up to 2 or 3 seconds.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

E.g., while above various examples have been disclosed in the context of DSL protocols, respective techniques may be readily applied to other kinds and types of communication systems.

The invention claimed is:

1. A method, comprising:
   receiving a coded signal via a physical link,
   decoding the received coded signal to obtain a result signal,
   detecting a link loss of a disturber physical link based on the coded signal, the decoding of the coded signal, or both, wherein an error correction code is determined to combat noise related to the disturber physical link, wherein an action is to be taken responsive to the link loss of the disturber physical link that includes a mitigation of an effect related to the link loss of the disturber physical link, the link loss being further determined based on energy across a plurality of samples in a frequency domain.

2. The method of claim 1,
   wherein the link loss of the physical link is detected based on a temporal evolution of the at least one of the coded signal and/or the decoding in a time interval having a duration in the range of 3-15 ms.

3. The method of claim 1,
   wherein the link loss is detected based on the decoding of the coded signal, wherein the decoding provides an error signal indicative of a presence of errors in the coded signal,
wherein the link loss is detected based on the error signal.

4. The method of claim 3,
wherein the error signal is indicative of a number of adjacent erroneous symbols in the coded signal,
wherein the method further comprises:
  executing a threshold comparison between the number of adjacent erroneous symbols and a predefined threshold,
wherein the link loss is selectively detected based on a result of the threshold comparison.

5. The method of claim 3,
wherein the decoding of the coded signal comprises decoding using a second-stage redundancy decoder operating based on the error signal.

6. The method of claim 1,
wherein the decoding of the coded signal comprises decoding using a Viterbi decoder.

7. The method of claim 6,
wherein the link loss is detected based on the decoding of the coded signal,
wherein the decoding provides an error signal indicative of a presence of errors in the coded signal,
wherein the link loss is detected based on the error signal,
wherein the method further comprises
  determining the error signal based on a difference between different Viterbi paths of the Viterbi decoder.

8. The method of claim 1,
wherein the decoding of the coded signal comprises decoding using a Quadrature Amplitude Modulation, QAM, decoder.

9. The method of claim 8,
wherein the link loss is detected based on the decoding of the coded signal,
wherein the decoding provides an error signal indicative of a presence of errors in the coded signal,
wherein the link loss is detected based on the error signal,
wherein the method further comprises:
  determining the error signal based on an Euclidean distance between a constellation point of a symbol of the coded signal and a constellation point of a predefined carrier.

10. The method of claim 1,
wherein the decoding of the coded signal comprises decoding using a low-density parity check, LDPC, decoder.

11. The method of claim 10,
wherein the link loss is detected based on the decoding of the coded signal,
wherein the decoding provides an error signal indicative of a presence of errors in the coded signal,
wherein the link loss is detected based on the error signal,
wherein the method further comprises
  determining the error signal based on a log-likelihood estimate between a constellation point of a symbol of the coded signal and a constellation point of a predefined carrier.

12. The method claim 1,
wherein the coded signal is modulated using at least one carrier,
wherein the link loss is detected based on the coded signal,
wherein the method further comprises:
  measuring energy levels of a plurality of resource blocks of the coded signal,
wherein the link loss is determined based on the measured energy levels.

13. The method of claim 12, further comprising:
executing a threshold comparison between energy levels of the plurality of resource blocks and a predetermined threshold,
wherein the link loss is selectively determined based on a result of the threshold comparison.

14. The method of claim 12,
wherein the coded signal is modulated using a plurality of carriers,
wherein the plurality of resources blocks are adjacent time samples of the coded signal or adjacent carriers of the coded signal.

15. The method of claim 1,
wherein the result signal comprises a sequence of bits forming transmission frames,
wherein the link loss of the physical link is further detected based on a checksum of at least one of the transmission frames.

16. The method of claim 1,
wherein the physical link comprises a copper wire,
wherein the method further comprises:
  in response to determining the link loss of the physical link, removing a Digital Subscriber Line channel implemented via the physical link from a Digital Subscriber Line vector engine calculation, the Digital Subscriber Line vector engine calculation removing far-end crosstalk between the physical link and a plurality of further physical links.

17. The method of claim 16, further comprising:
retaining further Digital Subscriber Line channels implemented via the further physical links at the Digital Subscriber Line vector engine calculation.

18. The method of claim 1,
wherein the link loss corresponds to the physical link being interrupted and prohibiting communication.

19. The method of claim 1, wherein the action to be taken responsive to the link loss of the disturber physical link includes an action for a second physical link that is affected by the link loss of the disturber physical link.

20. A device, comprising:
a receiver configured to receive a coded signal via a physical link, the coded signal having been coded by a Trellis coded modulation (TCM) encoder,
a decoder configured to decode the received coded signal to obtain a result signal,
at least one processor configured to detect a link loss of a disturber physical link based on the coded signal, the decoding of the coded signal, or both, wherein an error correction code is determined to combat noise related to the disturber physical link, wherein an action is to be taken responsive to the link loss of the disturber physical link that includes a mitigation of an effect related to the link loss of the disturber physical link, the link loss being further determined based on energy across a plurality of samples in a frequency domain.

* * * * *